United States Patent

Nakatsuka

[19]

[11] Patent Number: 5,945,884
[45] Date of Patent: Aug. 31, 1999

[54] OSCILLATION CIRCUIT FOR IMPROVING C/N RATIO

[75] Inventor: Kenji Nakatsuka, Fukushima-ken, Japan

[73] Assignee: Alps Electric Co., Ltd., Tokyo, Japan

[21] Appl. No.: 08/988,435

[22] Filed: Dec. 11, 1997

[30] Foreign Application Priority Data

Dec. 11, 1996 [JP] Japan ..................................... 8-346557

[51] Int. Cl.⁶ ........................................................ H03B 5/12
[52] U.S. Cl. ........................................ 331/117 R; 331/36 C; 331/117 FE; 331/177 V
[58] Field of Search .......................... 331/117 R, 117 FE, 331/117 D, 175, 36 C, 116 R, 116 FE, 177 V

[56] References Cited

U.S. PATENT DOCUMENTS

| | | |
|---|---|---|
| 3,909,748 | 9/1975 | Yuan et al. ............................ 331/117 R |
| 4,593,255 | 6/1986 | Matsuura ............................... 331/117 R |
| 5,565,821 | 10/1996 | Murtojarvi . |
| 5,576,667 | 11/1996 | Goma ....................................... 331/117 |

FOREIGN PATENT DOCUMENTS

| | | | |
|---|---|---|---|
| 1245456 | 9/1960 | France | ................................... 331/117 |
| 07231219 | 8/1995 | Japan . | |

*Primary Examiner*—David Mis
*Attorney, Agent, or Firm*—Brinks Hofer Gilson & Lione

[57] ABSTRACT

The object of this invention is an oscillation circuit that increases the Q of the parallel resonance circuit and increases the C/N (carrier-to-noise) ratio. The oscillation circuit contains two feedback capacitors connected between the base and emitter and between the emitter and collector of a transistor. Two inductors are also connected in series between the base and the collector of the transistor. One end of a resistor is connected to the emitter of the transistor and the other end is connected between the two inductors. The feedback capacitors and inductors constitute a parallel resonance circuit that may be tuned to create an equipotential across the ends of the resistor so that no current flows through it thus increasing both Q and the C/N ratio.

2 Claims, 3 Drawing Sheets

OSCILLATION CIRCUIT FOR IMPROVING C/N RATIO

BACKGROUND OF THE INVENTION

1. Field of the Invention

The present invention relates to an oscillation circuit, and more particularly to an oscillation circuit suitable for use in a local oscillation of a narrow-band communication.

2. Description of the Related Art

A conventional oscillation circuit will be decribed with reference to FIG. 6. The oscillation circuit shown in FIG. 6 is a collector grounded type Colpitts oscillator, a collector of an oscillation transistor (hereinafter, simply referred to a transistor) 1 is connected to the ground (earth) through a grounding capacitor 2 with a low impedance in high frequency-wise. Also, feedback capacitors 3, 4 are connected between a base and an emitter, and between the emitter and the ground, respectively, and further, a coil 6 is connected between the base and the ground through a clap capacitor 5. As a result of this, a parallel resonance circuit 7 is formed with such a manner that two feedback capacitors 3, 4 are inserted through in a series, and also the coil 6 is connected in parallel to these two feedback capacitors 3, 4 connected in the series. To the coil 6, a correction capacitor 8 connected in series and a varactor diode 9 are connected in parallel, and to a cathode of this varactor diode 9, a tuning voltage is applied through a feeding resistor 10. Each of one ends of the feedback capacitor 4 and the coil 6, and an anode of the varactor diode 9 are directly connected to the ground, and connected to a collector of the transistor 1 through the ground and an earthed capactor 2 in high frequency-wise. Further, the clap capacitor 5 is the one which is not absolutely necessary.

To a base of the transistor 5, a bias voltage is provided by the base-biased resistors 12, 13 which are connected between the power supply terminal 11 and the ground, and also an emitter-biased resistor 14 is connected between the emitter and the ground. As the base-biased resistors 12, 13, usually the ones having the resistance value of a few Kilo-ohms are used, but as the emitter-biased resistor 14, the one having a resistance value of 100 to 200 ohms is used in the oscillation circuit which is driven by a low voltage.

The oscillation circuit with the above described structure is a most general one, and even though a detail description of its operation will be omitted, a parallel circuit 15 composed of the clap capacitor 5, the coil 6, the correction capacitor 8, and the varactor diode 9 turns to be an inductive as a whole, and by being connected in parallel to the feedback capacitors 3, 4 which are connected in series, a parallel resonance circuit 7 is configured between the collector and the base of the transistor 1, and an oscillation is hold from the fact that both ends of the parallel resonance circuit 7, that is, the collector and the base of the transistor 1 will become in a relation of an opposite phase by taking the connecting point of the feedback capacitors 3, 4, i.e., the emitter of the transistor 1 as a middle point.

This kind of oscillation circuit is widely used as the VCO (Voltage Control Oscillator) which tried to make it miniaturizing, electric power-saving, drive voltage-reducing, as for use in a portable telephone, recently, but accompanying with it, the C/N (Carrier v.s. Noise ratio) which is an important performance of the oscillation circuit is decreasing. The main reason for that is a decrease of the non-load Q as a result of a miniaturization, and further, a decrease of the Q of the parallel resonance ciruit 7 according to a bias resistance of the transistor 1, and more particularly, to the emitter-biased resistor 14 of a low resistance value. The emitter-biased resistor 14 is connected to the feedback capacitor 4 in parallel, and upon receiving a resonance voltage generated on both ends of the parallel resonance circuit 7 a portion of a resonance current flows, and upon consuming an electric power it will reduce the Q of the parallel resonance, thereby reducing the C/N. Smaller the resistance value of the emitter-biased resistor 14, larger the reductions of the Q and C/N. Then, since more voltage-reducing the drive voltage of the oscillation circut, the resistance value of the emitter biased resistor 14 has to be made smaller (in order to secure a predetermined voltage between the collector, emitter of the transistor 1), the reduction of the Q and the reduction of the C/N have been become very important problems.

SUMMARY OF THE INVENTION

Accordingly, it is an object of the present invention to make the C/N of the oscillation circuit larger by increasing the Q of the parallel oscillation circuit 7.

In order to solve the above mentioned problems, the oscillation circuit according to the present invention, comprises a transistor for use in a feedback amplification; a first feedback capacitor connected between a base and an emitter of the transistor; a second feedback capacitor connected between the emitter and a collector of the transistor; a first inductor one end of which is connected to the base; a second inductor one end of which is connected to the collector, and the other end of which is connected the other end of the first inductor, the second inductor constituting a parallel resonance circuit, together with the each feedback capacitors and the first inductor; and a resistor for biasing an emitter one end of which is connected to the collector, and the other end of which is connected to a connecting point of the two inductors, wherein, in an oscillation frequency, an impedance of the first inductor and an impedance of the first feedback capacitor is approximately equal.

Further, the oscillation circuit of the present invention is constituted by an oscillation circuit of a base grounded type or of a collector grounded type of which one end of either one of the two inductors is directly connected to the ground.

Furthermore, the oscillation circuit, comprising: a transistor for use in a feedback amplification; a first feedback capacitor connected between a base and an emitter of the transistor; a second feedback capacitor connected between the emitter and a collector of the transistor; an inductor connected between the base and the collector, and constituting a parallel resonance circuit together with the two feedback capacitors; an inductor for use in high frequency blocking connected between the emitter and the ground; and a resistor for biasing an emitter, wherein, in an oscillation frequency, an impedance of the inductor for use in high frequency blocking is sufficiently larger than an impedance of each of the feedback capacitors.

DESCRIPTION OF THE PREFERRED EMBODIMENTS

Figure 1:
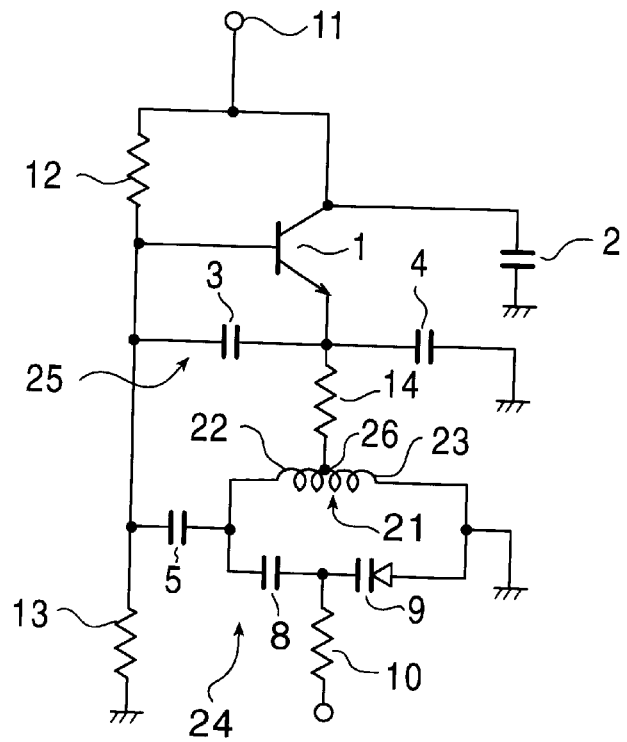
FIG. 1 is a view showing a first embodiment of an oscillation circuit according to the present invention.
Figure 2:
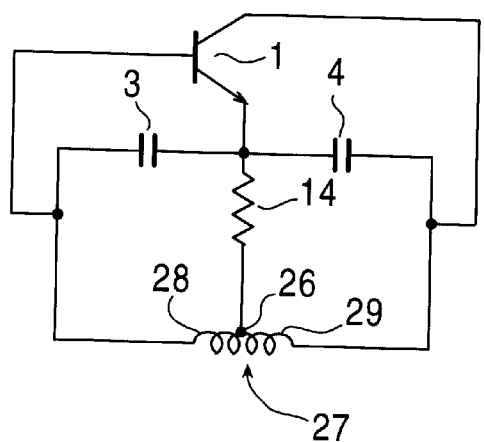
FIG. 2 is a view showing an equilavent circuit of FIG. 1.
Figure 3:
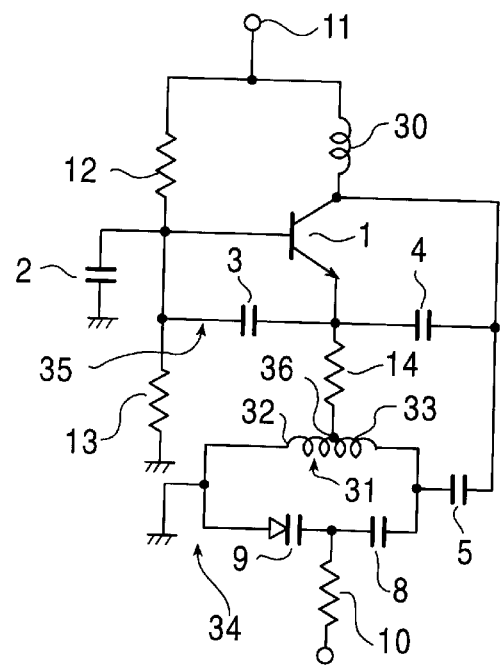
FIG. 3 is a view showing another example of the first embodiment of the oscillation circuit according to the present invention.
Figure 4:
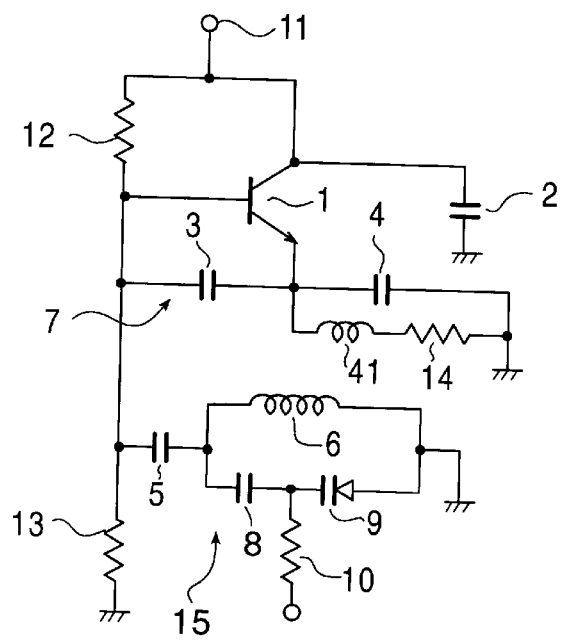
FIG. 4 is a view showing a second embodiment of the oscillation circuit according to the present invention.
Figure 5:
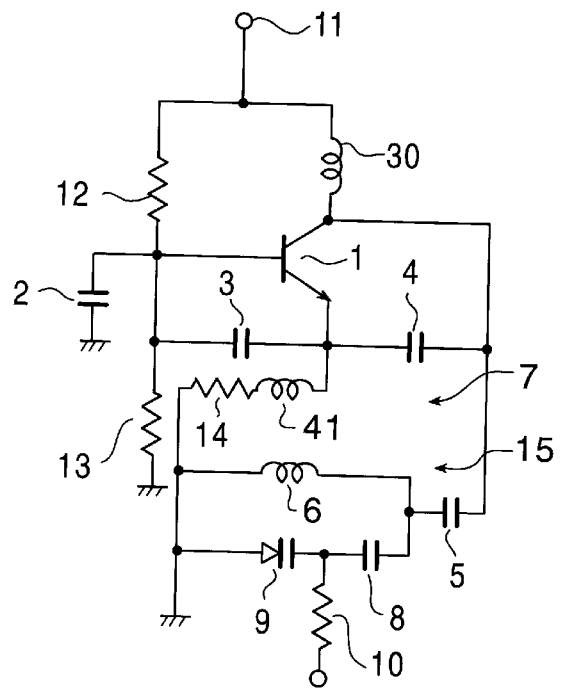
FIG. 5 is a view showing anther example of the second embodiment of the oscillation circuit according to the present invention.

In the following, with reference to FIGS. 1 to 3, the first embodiment of the present invention will be decribed, and further with reference to FIGS. 4 to 5, the second embodiment of the present invention will be described. Here, FIG. 1 shows an oscillation circuit of a collector grounded type, FIG. 2 shows an equivalent circuit thereof, FIG. 3 shows an oscillation circuit of a base grounded type. Also, FIG. 4 shows an oscillation circuit of an collector grounded type, FIG. 5 shows an oscillation circuit of a base grounded type. Further, in these figures, the same numbers are used for the same elements as in the conventional ones, and the descriptions thereof are omitted.

Figure 6:
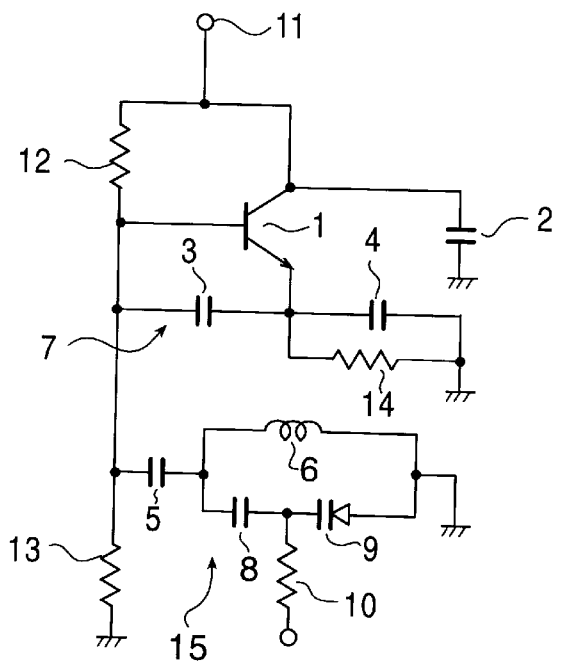
FIG. 6 is a view showing a conventional oscillation circuit.

At first, in FIG. 1, for two feedback capacitors 3, 4 connected in parallel, a coil 21 connected in parallel through a clamp capacitor 5 is configured in such a manner that two coils 22, 23 are connected in series, an inductance of this coil 21 is the same as the one of the coil 6 in a conventional oscillation circuit shown in FIG. 6. Then, a series-parallel circuit 24 which is composed of a clamp capacitor 5, a correction capacitor 8, a varactor diode 9, and a coil 21, becomes an inductive as a whole, and is connected to the feedback capacitors 3, 4 in parallel so as to form a parallel resonance circuit 25.

Furthermore, one end of the coil 21 and an anode of the varactor diode 9 are directly connected to the ground. An oscillation circuit of a collector grounded type is configured according to this.

On the one hand, an emitter-biased resistor 14 of a transistor 1 ot is connected to an connection point of the coils 22 and 23. Further, herein, although two coils 22, 23 are connected in series, it is fine to provide a middle tap using one coil, and in that case the middle tap becomes a middle point. When doing so, the emitter-biased resistor 14 is not connected in parallel to the feedback capacitor 4, accordingly, a resonance current flowing to the emitter-biased resistor 14 decreases as compared to the conventional oscillation circuit, and the Q of the parallel resonance circuit 25 becomes higher. Further, it will be ideal if the connecting point 26 of the coils 22 and 23 is to be set such that a resonance voltage to be generated between the base and emitter of the transistor 1, that is, a resonance voltage to be generated on both ends of the feedback capacitor 3, and a resonance voltage to be generated between the base of the transistor 1 and the connecting point 26 would be equal, and a resonance voltage to be generated between the emitter and the collector (ground) of the transistor 1, that is, a resonance voltage to be generated on both ends of the feedback capacitor 4, and a resonance voltage to be generated between the connecting point 26 and the ground would also be equal, and the emitter of the transisor 1 and the connecting point 26 will become an equi-potential, and no resonance current flow through the emitter- biased resistor 14 connected between the emitter of the transistor 1 and the connecting point 26, and the Q of the parallel resonance circuit 25, therefore, the C/N of the oscillation circuit becomes much higher.

Also, by varying the tuning voltage a capacitance value of the varactor diode 9 will change, and as a result, a difference will be occurred between a potential of the connecting point 26 and a potential of the emitter of the transistor 1. This is because of an existence of the clap capacitor 5. Accordingly, for maintaining the potential of the connecting point 26 and the potential of the emitter of the transistor 1 to be equal, it is necessary to change an inductance ratio of the coils 22 and 23, but since its difference is very small, there is no practical problem at the middle value of the capacitance variation of the varactor diode 9 even if the inductance values of the coils 22, 23 are determined.

FIG. 2 shows an equivalent circuit of the oscillation circuit of FIG. 1, but herein, the coil 27 is the one which shows equivalently the series-parallel circuit 24 of FIG. 1. The coils 28, 29 which constitute the coil 27 are the equivalent one which includes the clap capacitor 5, the correct capacitor 8, and the varactor diode 9, and thus will not match with the coils 22, 23 of FIG. 1. Herein, the feedback capacitors 3, 4 and the coils 28, 29 turn to constitute a so-called bridge circuit, and the bridge circuit will be in an equilibrium by making the impedance ratio of the feedback capacitors 3, 4 and the impedance ratio of the coils 28, 29 to be equal, thereby no resonance current flow through the emitter-biased resistor 14. Herein, the equilibrium is nothing but the resonance voltage generated on both ends of the feeding capacitor 3 and the the resonance voltage generated between the base of the transistor 1 and the connecting point 26 turn to be equal.

FIG. 3 shows the one which constitutes the first embodiment of the present invention with the oscillation circuit of the base grounded type, and the base of the transistor 1 is connected to the ground with the earth capactor 2, and also the collector thereof is connected to the power supply terminal 11 with the coil 30 for a high frequency blocking. Then, for two feedback capacitors 3, 4 connected in series, the coil 31 which is connected in parallel through the clap capacitor 5 is constituted with connecting two coils 32, 33 in series, and an inductance value of this coil 31 is the same as that of the coil 6 in the conventional oscillation circuit shown in FIG. 6. Then, the series-parallel circuit 34 which is composed of the clap capacitor 5, the correction capacitor 8, the varactor diode 9, and the coil 31 is turned to be inductive as a whole, and is connected in parallel to the feeback capacitors 3, 4 connected in series, thereby constituting the parallel resonance circuit 35. However, the clap capacitor 5 is connected to the collector side of the transistor 1, and the one end of the coil 32 and the anode of the varactor diode 9 are directly connected to the ground. Thereby, the oscillation circuit of the base grounded type is being formed.

Then, in much the same fashion with the oscillation circuit of the collector grounded type, the emitter-biased resistor 14 of the transistor 1 is connected to the connecting point 36 of the coils 32 and 33, then this connecting point 36 is set in such a manner that the resonance voltage generated on both ends of the feedback capacitor 3 and the resonance voltage generated on both ends of the coil 32 turn to be equal. As a result, the resonance voltage generated on both ends of the feedback capacitor 4 and the resonance voltage generated between the connecting point 36 and the collector also turn to be equal, and the emitter of the transistor 1 and the connecting point 36 become equipotential. Accordingly, no resonance current flow through the emitter-biased resistor 14 which is connected between the emitter of the transistor 1 and the connecting point 36, and the Q of the parallel-resonance circuit 35 will increase, thereby the C/N of the oscillation circuit will improve.

As described above, in the first embodiment of the oscillation circuit according to the present invention, since the emitter-biased resistor 14 is being connected between the emitter of the transistor 1 and the connecting point 26 or 36 of two coils, the resonance current which flows through the emitter-biased resistor 14 will decrease as compared to that of the conventional oscillation circuit, and the Q of the parallel resonance circuit 25 and 35 will increase. Furthermore, by setting the connecting point 26 or 36 of two coils to a location where the resonance voltage generated in the feedback capacitor 3 and the resonance voltage generated between the base of the transistor 1 and the connecting point 26 or 36 turn to be equal, it is possible to make no resonance current to be flown through the emitter-biased resistor 14, so as to much increase the Q of the parallel resonance circuit 25 or 35. In addition, with directly connecting two coils 23 or 32 to the ground, the oscillation circuit of the collector grounded type or of the base grounded type can be simply formed by only connecting the emitter-biased resistor to the connecting point 26 or 36.

Next, the second embodiment of the oscillation circuit according to the present invention will be described with reference to FIGS. 4 and 5. A part in the second embodiment of the present invention shown in FIG. 4, which differs from the conventional oscillation circuit shown in FIG. 6 is the fact that the emitter-biased resistor 14 of the transistor 1 is connected between the emitter and the ground, with being connected in series to the capacitor 41 for use in high frequency blocking. As a result, the coil 41 for use in high frequency blocking and the emitter-biased resistor 14 being connected in series are turned to be connected in parallel to the feedback capacitance 4. Then, the impedance of this coil 14 for use in high frequency blocking is being set, in an oscillation frequency, as turning to be sufficiently larger than the impedance of the feedback capacitor 4.

As such, even though the resonance voltage is being generated on both ends of the feedback capacitor 4 with the emitter-biased resistor 14 being connected in series to the coil 41 for use in high frequency blocking and being connected to the ground, because the resonance current which flows through the emitter-biased resistor 14 will decrease by high impedance of the coil 41 for use in high frequency blocking, the Q of the parallel resonance circuit 7 will increase, thereby the C/N will improve. Further, by making the impedance of the coil 41 for use in high frequency blocking, an influence to the feedback capacitor 4 connected between the emitter and collector will cease, and accordingly, no correction to the capacitance value of the feedback capacitor 4 is required.

FIG. 5 shows the second embodiment of the oscillation circuit according to the present invention, constituted with the base grounded type, but in much the same fashion with the collector grounded type of FIG. 4, the emitter-biased resistor 14 is connected between the emitter of the transistor 1, which is connected in series to the coil 41 for use in high frequency blocking and the ground. Further, in FIG. 5, the series-parallel circuit 15 which is composed of the clap capacitor 5, the coil 6, the correction capacitor 8, and the varactor diode 9, differs from the oscillation circuit of the collector grounded type of FIG. 4, in such a point that the clap capacitor 5 is connected to the collector side of the transistor 1. Then, the coil 4 for high frequency blocking and the emitter-biased resistor 14 connected in series turn to be connected in parallel to the feedback capacitance 3, and also, in this case the impedance of the coil 41 for use in high frequency blocking is set to be, in an oscillation frequency, larger than the impedance of the feedback capacitor 3. As a result, also with the resonance voltage generated on both ends of the feedback capacitor 3, for the coil 41 for use in high frequency blocking, the resonance current which flows through the emitter-biased resistor 14 can be decreased, and the Q of the parallel resonance circuit 7 turns to be larger, and the C/N is improved, but no correction is required for the capacitance value of the feedback capacitor 3.

Further, in the embodiments of the present invention, they are described using the coils, but the present invention can be similarly implemented using other elements which turn to be inductance in the same fashion as the coils, for example, a microstrip line and the like which is composed of a conductive pattern formed on a print wiring substrate and the like.

As described above, the oscillation circuit of the present invention is provided with two feedback capacitors connected in series, and two inductors connected in series which consititute a parallel resonance circuit together with these feedback capacitors, and an emitter-biased resistor is connected to a connecting point of an emitter of the transistor and two inductors each other, so that the resonance current which flows the emitter biased resistor turns to be relatively decreased as compared to the conventional oscillation circuit, and the Q of the parallel resonance circuit increases, thereby the C/N of the oscillation circuit could be improved.

Also, because the oscillation circuit of the present invention sets the connecting point of two inductors to a location where the resonance voltage generated on both ends of the feedback capacitor connected between the base and the emitter, and the resonance voltage generated between the base and the connecting point of two inductors each other will turn to be equal, it is possible to make the resonance current not flowing through the emitter-biased resistor, so that the Q of the parallel resonance circuit an d the C/N of the oscillation circuit could be much increased.

Further, because the oscillation circuit of the present invention directly connects one end of either one of two inductors to the ground, the oscillation circuit of the collector grounded type or of the base grounded type could be simply constituted by only connecting the emitter-biased resistor to the connecting point of two inductors.

In addition, because the oscillation circuit of the present invention respectively connects the feedback capacitors between the base and emitter, as well as between the emitter and collector of the transistor, and also connects the inductor for use in high frequency blocking and the emitter biased resistor in series, the resonance current which flows through the emitter-biased resistor can be decreased, because of the inductor for use in high frequency blocking, also by the resonance voltage generated on both ends of the feedback capacitor, so that the Q of the parallel resonance circuit and the C/N of the oscillation circuit could be increased.

Furthermore, because the oscillation circuit of the present invention is made the impedance of the inductor for use in high frequency blocking to be sufficiently larger than the impedance of the feedback capacitor, so that the resonance current which flows the emitter biased resistor could be much decreased, and the Q of the parallel resonance circuit as well as the C/N of the oscillation circuit could be much increased, and moreover, no correction is required for the capacitance value of the feedback capacitor.

What is claimed is:

1. An oscillation circuit, comprising:
   a transistor for use in a feedback amplification;
   a first feedback capacitor connected between the base and the emitter of said transistor;
   a second feedback capacitor connected between said emitter and the collector of said transistor;
   a first inductor one end of which is connected to said base;
   a second inductor one end of which is connected to said collector and the other end of which is connected to the other end of said first inductor, said second inductor together with each of said feedback capacitors and said first inductor constituting a parallel resonance circuit; and
   a resistor for providing an emitter bias voltage to said emitter, one end of said resistor being connected to said emitter, and the other end of said resistor being connected to a connection point of said two inductors,
   wherein, at a designed oscillation frequency, the impedance of said first inductor and the impedance of said first feedback capacitor are approximately equal.

2. An oscillation circuit according to claim 1, wherein said oscillation circuit is an oscillation circuit of a base grounded type of which one end of the appropriate inductor connected directly to the ground.

* * * * *

UNITED STATES PATENT AND TRADEMARK OFFICE
CERTIFICATE OF CORRECTION

PATENT NO. : 5,945,884
DATED : August 31, 1999
INVENTOR(S) : Kenji Nakatsuka It is certified that error appears in the above-identified patent and that said Letters Patent is hereby corrected as shown below:

In claim 2, line 3, after "inductor" insert --is--.

Signed and Sealed this

Ninth Day of May, 2000

Attest:

Q. TODD DICKINSON

*Attesting Officer*     *Director of Patents and Trademarks*